(12) United States Patent
Juang et al.

(10) Patent No.: US 9,856,416 B2
(45) Date of Patent: *Jan. 2, 2018

(54) PHOSPHOR AND LIGHT EMITTING DEVICE

(75) Inventors: Yuan-Ren Juang, Tainan (TW);
Jen-Shrong Uen, Tainan (TW);
Chih-Lung Lin, Tainan (TW)

(73) Assignee: Chi-Mei Corporation, Tainan (TW)

( * ) Notice: Subject to any disclaimer, the term of this patent is extended or adjusted under 35 U.S.C. 154(b) by 406 days.

This patent is subject to a terminal disclaimer.

(21) Appl. No.: 13/158,931

(22) Filed: Jun. 13, 2011

(65) Prior Publication Data

US 2012/0091879 A1    Apr. 19, 2012

(30) Foreign Application Priority Data

Oct. 15, 2010   (TW) ............................... 99135365 A

(51) Int. Cl.
*C09K 11/08* (2006.01)
*C09K 11/77* (2006.01)
*H01L 33/50* (2010.01)

(52) U.S. Cl.
CPC ...... *C09K 11/0883* (2013.01); *C09K 11/7734* (2013.01); *H01L 33/502* (2013.01); *H01L 2224/48091* (2013.01); *H01L 2224/48247* (2013.01); *H01L 2224/8592* (2013.01); *H01L 2924/181* (2013.01)

(58) Field of Classification Search
CPC . C09K 11/025; C09K 11/0883; C09K 11/643; C09K 11/7703; C09K 11/7718; C09K 11/7721; C09K 11/7728; C09K 11/7761; C09K 11/7768; C09K 11/7773; C09K 11/7774; C09K 11/7783; C09K 11/7792; C09K 11/7731; C09K 11/7746; C09K 11/7787; H01L 33/502; H01L 33/504; H05B 33/14; Y01S 428/917; Y01S 362/80
USPC ...... 252/301.4 F, 301.4 R, 301.6 F; 313/467, 313/483, 486, 501, 503; 428/690
See application file for complete search history.

(56) References Cited

U.S. PATENT DOCUMENTS

| 8,203,259 | B2 * | 6/2012 | Juang et al. ................... 313/484 |
| 2005/0189863 | A1 * | 9/2005 | Nagatomi .......... C09K 11/7734 313/486 |
| 2006/0255710 | A1 * | 11/2006 | Mueller-Mach et al. ..... 313/485 |
| 2007/0007494 | A1 * | 1/2007 | Hirosaki ............. C01B 21/0602 252/301.4 R |
| 2008/0128726 | A1 * | 6/2008 | Sakata ................ C01B 21/0602 257/98 |
| 2009/0194781 | A1 * | 8/2009 | Harada ................ C09K 11/025 257/98 |
| 2009/0295272 | A1 * | 12/2009 | Oshio .......................... 313/503 |

FOREIGN PATENT DOCUMENTS

| CN | 1918262 | 2/2007 |
| CN | 102453485 | 5/2012 |
| JP | 2006008721 A | 1/2006 |
| JP | 2006282809 A | 10/2006 |
| JP | 2007262122 A | 10/2007 |
| JP | 2008007751 A | 1/2008 |

OTHER PUBLICATIONS https://ahdictionary.com/word/search.html?q=intrinsic.*

* cited by examiner

*Primary Examiner* — Matthew E. Hoban
*Assistant Examiner* — Lynne Edmondson
(74) *Attorney, Agent, or Firm* — Muncy, Geissler, Olds & Lowe, P.C.

(57) ABSTRACT

The present invention provides a phosphor, including a constituent having the formula $Ca_pSr_qM_mA_aB_bO_nN_n:Z_r$, in which M selected from the group consisting of magnesium, barium, beryllium and zinc; A selected from the group consisting of aluminum, gallium, indium, scandium, yttrium, lanthanum, gadolinium and lutetium; B selected from the group consisting of silicon, germanium, tin, titanium, zirconium and hafnium; Z selected from the group consisting of europium and cerium; $0<p<1$; $0 \leq q<1$; $0 \leq m<1$; $0 \leq t \leq 0.3$; $0.00001 \leq r \leq 0.1$; $a=1$, $0.8 \leq b \leq 1.2$; and $2.7 \leq n \leq 3.1$. Moreover, the normalized dissolved content of calcium of the phosphor is 1~25 ppm, thereby obtaining a phosphor of high brilliance in the 600~680 nm region. In addition, the present invention at the same time provides a high brilliance light emitting device.

25 Claims, 2 Drawing Sheets

PHOSPHOR AND LIGHT EMITTING DEVICE

BACKGROUND OF THE INVENTION (a) Field of the Invention

The present invention relates to a nitride phosphor is used in illumination units, such as monitors, liquid crystal back light sources, fluorescent lamps, and light-emitting diodes. The present invention further relates to compositions of the nitride phosphor and a light emitting device comprising the phosphor.

(b) Description of the Prior Art

Semiconductor-based light emitting devices have been extensively used in recent years, especially light-emitting diodes, which have already been successively developed. Because such light emitting devices are provided with the characteristics of high luminescence efficiency, small size, low power consumption and low cost than conventional light emitting apparatus such as cold cathode tubes and incandescent lamps, thus, they are applicable for use in various types of light sources. Semiconductor-based light emitting devices comprise a semiconductor light-emitting element and a phosphor, in which the phosphor absorbs and converts the light emitted from the semiconductor light-emitting element. The light emitted from the semiconductor light-emitting element and the light converted and emitted from the phosphor are mixed and utilized. Such light emitting devices are applicable for use in various areas, including fluorescent lamps, vehicles lighting, monitors, backlit liquid crystal displays, and the like. In which, white light emitting devices are the most extensively used. Current white light emitting devices are assembled by means of a YAG (yttrium aluminum garnet) phosphor ($Y_3Al_5O_{12}$:Ce) with cerium as the active center and a semiconductor light-emitting element emitting blue light. However, using the mixed light emitted from a $Y_3Al_5O_{12}$:Ce phosphor combined with a semiconductor light-emitting element emitting blue light, the color coordinates of the mixed light are positioned on the connecting line between the color coordinates of the blue light emitted from semiconductor light-emitting and the color coordinates of the light emitted from $Y_3Al_5O_{12}$:Ce phosphor. Hence, the emitted mixed light is white light deficient in red light, and color rendering properties and color saturation are clearly insufficient. In addition, the preferred region of the excitation spectrum of the $Y_3Al_5O_{12}$:Ce and the luminescence region of the semiconductor light-emitting element are inconsistent, thereby causing poor conversion efficiency of excitation light, and a high brilliance of white light source is difficult to obtain. In order to resolve the phenomena of poor chromaticity and low luminescence brilliance, YAG:Ce phosphors mixed with red light phosphors have been actively developed in recent years, and the quality of phosphors emitting red light has also been improved to increase luminescence brilliance.

However, phosphors able to absorb blue light and emit red light or red biased light are scarce. Current industrial research and development has primarily focused on phosphors using nitride and nitrogen oxide compounds. Insofar as is known by the inventors, such phosphors include $Sr_2Si_5N_8$:Eu phosphors with europium (Eu) as the active center, $CaAlSiN_3$:Eu phosphors and the sialon phosphor having the general formula: $MgSi_{12-(m+n)}Al_{m+n}O_nN_{16-n}$:Eu. However, because the crystal itself has poor heat resisting properties, thus, the $Sr_2Si_5N_8$:Eu phosphor has the disadvantages of decrease in brilliance and color rendering properties after long term usage. And, although the sialon phosphor itself has no durability problems, however, luminescence brilliance of the phosphor is clearly insufficient, and thus not commercially popular. Although $CaAlSiN_3$:Eu phosphors have preferred durability, and provide better brilliance compared to sialon phosphors, however, industries are still expecting further improvement in the luminescence brilliance of the phosphor, thereby enabling the light emitting device to be provided with higher luminescence efficiency.

SUMMARY OF THE INVENTION

In light of the aforementioned problems, the objective of the present invention lies in providing phosphor material of high brilliance, which can be used in combination with a semiconductor light-emitting element to fabricate a light emitting device of high brilliance.

In order to achieve the aforementioned anticipated objective, the present invention provides a phosphor comprising a constituent having the formula—$Ca_pSr_qM_mA_aB_bO_tN_n:Z_r$, in which M is selected from a group consisting of magnesium, barium, beryllium and zinc, and combinations thereof; A is selected from a group consisting of aluminum, gallium, indium, scandium, yttrium, lanthanum, gadolinium and lutetium, and combinations thereof; B is selected from a group consisting of silicon, germanium, tin, titanium, zirconium and hafnium, and combinations thereof; Z is selected from a group consisting of europium and cerium, and combinations thereof; $0<p<1$; $0\leq q<1$; $0\leq m<1$; $0\leq t\leq 0.3$; $0.00001\leq r\leq 0.1$; $a=1$, $0.8\leq b\leq 1.2$; and $2.7\leq n\leq 3.1$. Moreover, the normalized dissolved content of calcium of the phosphor is 1~25 ppm. The aforementioned normalized dissolved content of calcium is determined by the following method: A phosphor with electrical conductivity lower than 200 μs/cm is prepared by means of water scrubbing until the electrical conductivity is lower than 200 μs/cm, then pure water is added according to a 1:100 proportion by weight of the phosphor to pure water, thereby forming a mixed solution of the phosphor and water. After mixing, the container is sealed, and heated for 40 hours at a temperature of 80° C. The mixed solution is then cooled to room temperature, and the aqueous phase of the mixed solution is taken to determine the normalized dissolved content of calcium.

The present invention also provides the following phosphor:

In the aforementioned phosphor, the dissolved content of normalized calcium is 5~20 ppm.

In the aforementioned phosphor, $q=0$.

In the aforementioned phosphor, $0<p<1$. $0\leq q<1$.

In the aforementioned phosphor, the normalized dissolved content of calcium is 1~25 ppm, and the normalized dissolved content of strontium can be 1~20 ppm. The normalized dissolved content of strontium is determined by the following method: a phosphor with electrical conductivity lower than 200 μs/cm is prepared, and pure water is added according to a 1:100 proportion by weight of the phosphor to pure water, thereby forming a mixed solution of the phosphor and water. After heating for 40 hours at a temperature of 80° C., the mixed solution is cooled to room temperature, and the aqueous phase of the mixed solution is taken to determine the normalized dissolved content of strontium.

In the phosphor of the present invention, the normalized dissolved content of calcium is 5~20 ppm, and the normalized dissolved content of strontium is 3~17 ppm.

In the aforementioned phosphor, $0.05\leq p\leq 0.9$, $0.1\leq q\leq 0.95$.

In the aforementioned phosphor is excited by means of 455 nm light source to illuminate the phosphor, then the CIE 1931 color coordinates (x,y) on the chromaticity diagram are 0.6≤x≤0.7, 0.3≤y≤0.4.

In the aforementioned phosphor:

M is selected from a group consisting of magnesium and zinc, and combinations thereof;

A is selected from a group consisting of aluminum and gallium, and combinations thereof; and B is selected from a group consisting of silicon and germanium, and combinations thereof.

In the aforementioned phosphor, it is preferred that when a 455 nm light source is used for illumination, the phosphor emits wavelengths of 600~680 nm, and that the CIE 1931 color coordinates (x,y) of the phosphor on the chromaticity diagram are: 0.45≤x≤0.72, 0.2≤y≤0.5.

In the aforementioned phosphor, it is preferred that when a 455 nm light source is used for illumination, then the CIE 1931 color coordinates (x,y) of the light emitted from the phosphor on the chromaticity diagram are: 0.6≤x≤0.7, 0.3≤y≤0.4.

The present invention also provides a light emitting device, comprising:

A semiconductor light-emitting element, and the aforementioned phosphor.

The phosphor receives excitation light emitted from the semiconductor light-emitting element, and converts to emit light different to the excitation light.

The semiconductor light-emitting element in the aforementioned light emitting device is able to emit light having a wavelength of 300~550 nm.

The present invention primarily controls the normalized dissolved content of calcium of the phosphor within a specified range to obtain a phosphor of high brilliance. The present invention, at the same time, further controls the normalized dissolved content of calcium and the normalized dissolved content of strontium within a specified range to obtain a phosphor of high brilliance. The present invention also enables combining the phosphor with the semiconductor light-emitting element to obtain a high brilliance light emitting device.

In accordance with another aspect of present invention, there is provided a phosphor comprising: a constituent having formula $Ca_pSr_qM_mA_aB_bO_tN_n:Z_r$, wherein M is selected from the group of magnesium, barium, beryllium and zinc; A is selected from the group of aluminum, gallium, indium, scandium, yttrium, lanthanum, gadolinium and lutetium; B is selected from the group of silicon, germanium, tin, titanium, zirconium and hafnium; Z is selected from the group of europium and cerium; 0<p<1; 0≤q<1; 0≤m<1; 0≤t≤0.3; 0.00001≤r≤0.1; a=1, 0.8≤b≤1.2; and 2.7≤n≤3.1; and a normalized overdose content of calcium of the phosphor is 1~25 ppm; wherein the normalized overdose content of calcium of the phosphor is determined by obtaining a ratio of an overdose content of calcium of the phosphor to an overall content of calcium of the phosphor, said method comprising a material mixing step, and a phosphor firing step carried out at a temperature that is at least 1200° C. and does not exceed 2200° C.

In some examples within this aspect of the present invention, the overdose content of calcium is determined by the following method: a phosphor with electrical conductivity lower than 200 μs/cm is prepared and pure water was added according to a 1:100 proportion by weight of the phosphor to pure water, thereby forming a mixed solution of the phosphor and water, after heating for 40 hours at a temperature of 80° C., the mixed solution is then cooled to room temperature, and the aqueous phase of the mixed solution is taken to determine the overdose content of calcium.

In some examples within this aspect of the present invention, the overall content of calcium is the molar ratio of calcium to A, which is selected from the group of aluminum, gallium, indium, scandium, yttrium, lanthanum, gadolinium and lutetium, and is determined by inductively coupled plasma atomic emission spectrometer.

In some examples within this aspect of the present invention, it is preferred that normalized overdose content of calcium is 5~20 ppm.

In some examples within this aspect of the present invention, it is preferred that 0.05≤p≤0.9, 0.1≤q≤0.95.

In some examples within this aspect of the present invention, it is preferred that M selected from the group of magnesium and zinc; A selected from the group of aluminum and gallium; B selected from the group of silicon and germanium.

In some examples within this aspect of the present invention, it is preferred that wherein the phosphor is excited by light in wavelength of 455 nm, and emits light with dominant wavelength of 600~680 nm, and the color coordinates (x,y) of said emitted light base on CIE 1931 chromaticity diagram are 0.45≤x≤0.72, 0.2≤y≤0.5.

In some examples within this aspect of the present invention, the phosphor is excited by means of 455 nm light source to illuminate the phosphor, thereby the color coordinates (x,y) of the emitted light of phosphor on CIE 1931 chromaticity diagram are 0.6≤x≤0.7, 0.3≤y≤0.4.

In accordance with another aspect of present invention, there is provided a method of preparing a phosphor having formula $Ca_pSr_qM_mA_aB_bO_tN_n:Z_r$, wherein M selected from the group of magnesium, barium, beryllium and zinc; A selected from the group of aluminum, gallium, indium, scandium, yttrium, lanthanum, gadolinium and lutetium; B selected from the group of silicon, germanium, tin, titanium, zirconium and hafnium; Z selected from the group of europium and cerium; 0<p<1; 0≤q<1; 0≤m<1; 0≤t≤0.3; 0.00001≤r≤0.1; a=1, 0.8≤b≤1.2; and 2.7≤n≤3.1; and a normalized overdose content of calcium of the phosphor is 1~25 ppm; wherein the normalized overdose content of calcium of the phosphor is determined by obtaining a ratio of an overdose content of calcium of the phosphor to an overall content of calcium of the phosphor, said method comprising a material mixing step, and a phosphor firing step carried out at a temperature that is at least 1200° C. and does not exceed 2200° C.

In some examples within this aspect of the present invention, aforementioned material mixing step includes a mixing a calcium nitrides, which calcium nitrides is firing in above 99.99% nitrogen atmosphere at a temperature that is at least 600° C. and does not exceed 1000° C.

In some examples within this aspect of the present invention, aforementioned method further comprising a calcium nitrides firing step for producing calcium nitrides, wherein further comprising a first calcium nitrides firing step and a second calcium nitrides firing step, wherein the heating rate of first calcium nitrides firing step is greater than the second calcium nitrides firing step.

To enable a further understanding of said objectives and the technological methods of the invention herein, a brief description of the drawings is provided below followed by a detailed description of the preferred embodiment and examples.

Figure 1:
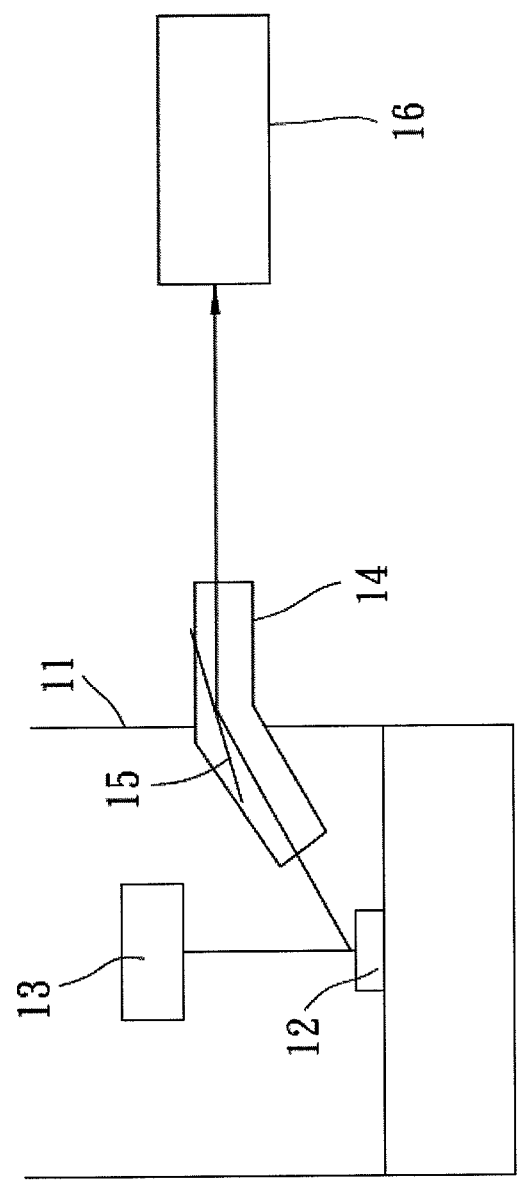
FIG. 1 is a schematic view depicting a brilliance measuring device.

DETAILED DESCRIPTION OF THE PREFERRED EMBODIMENT AND EXAMPLES phosphor of the present invention comprises a constituent having the formula: $Ca_pSr_qM_mA_aB_bO_tN_n:Z_r$, in which M is selected from a group consisting of magnesium, barium, beryllium and zinc, and combinations thereof; A is selected from a group consisting of aluminum, gallium, indium, scandium, yttrium, lanthanum, gadolinium and lutetium, and combinations thereof; B is selected from the group of silicon, germanium, tin, titanium, zirconium and hafnium; Z is selected from the group of europium and cerium; $0<p<1$; $0≤q<1$; $0≤m<1$; $0≤t≤0.3$; $0.00001≤r≤0.1$; $a=1$, $0.8≤b≤1.2$; and $2.7≤n≤3.1$. Moreover, the normalized dissolved content of calcium of the phosphor is 1~25 ppm. The normalized dissolved content of calcium of the phosphor is determined by the following method: a phosphor with electrical conductivity lower than 200 μs/cm is prepared, and pure water is added according to a 1:100 proportion by weight of the phosphor and pure water respectively, thereby forming a mixed solution of the phosphor and water. After mixing, the container is sealed, and heated for 40 hours at a temperature of 80° C. The mixed solution is then cooled to room temperature, and the aqueous phase of the mixed solution is taken to determine the normalized dissolved content of calcium.

In the formula of phosphor of the present invention, M is selected from a group consisting of magnesium, barium, beryllium and zinc, and combinations thereof. A is selected from a group consisting of aluminum, gallium, indium, scandium, yttrium, lanthanum, gadolinium and lutetium, and combinations thereof. For example, A can be exclusively aluminum elements, and can also be a mixture of aluminum and gallium elements. B is selected from a group consisting of silicon, germanium, tin, titanium, zirconium and hafnium, and combinations thereof. For example, B can be exclusively silicone elements, and can also be a mixture of silicone and germanium elements. Z is selected from a group consisting of europium and cerium, and combinations thereof. Ca is calcium, Sr is strontium, O is oxygen, N is nitrogen.

In the formula: $Ca_pSr_qM_mA_aB_bO_tN_n:Z_r$. $0<p<1$, $0≤q<1$, $0≤m<1$, in which: it is preferred that $0≤m<1$, $0≤m≤0.1$ is more preferred, and $0≤m≤0.05$ is the optimum preference; $a=1$; More preferred is when A is aluminum, which provides better luminescence brilliance; it is preferred that $0.8≤b≤1.2$, $0.9≤b≤1.1$ is more preferred; more preferred is when B is silicon and the value of b is 1, which provides better luminescence brilliance; it is preferred that $0≤t≤0.3$, and more preferred is $0≤t≤0.2$; it is preferred that $2.7≤n≤3.1$, and more preferred is $2.8≤n≤3.1$; when m, a, b, t are within the aforementioned ranges, then better luminescence brilliance is provided; it is preferred that $0.00001≤r≤0.1$; more preferred is when Z is europium (Eu), which provides better luminescence brilliance; when the value of r is smaller than 0.00001, the quantity of Eu of the luminescent center is few, thus, luminescence brilliance is reduced; when the value of r is greater than 0.1, a reduction in brightness occurs because of Eu interatomic mutual interference. More preferred is when the value of r is 0.002~0.03, which provides better luminescence brilliance.

In addition, the composition of the phosphor of the present invention at the same time contains calcium and strontium, in which $0<p<1$ and $0≤q<1$.

An increase in brilliance is achieved when $q=0$, however, when q is not equal to zero, then the preferred value of p is 0.02~0.95, while the preferred value of q is 0.05~0.98; more preferred values are $p=0.05~0.9$ and $q=0.1~0.95$. Regarding the relative relationship of the calcium and strontium, it is preferred that $0<(p+q)<1$ and $(p/q)=0.1~10$. More particularly, when the normalized dissolved content of calcium in the phosphor of the present invention is 1~25 ppm, it is found that the luminescence brilliance of the phosphor conforming to such a range is evidently increased.

In addition, the composition of the phosphor of the present invention at the same time contains calcium and strontium, in which when $0<p<1$ and $0<q<1$, it is preferred that the normalized dissolved content of calcium is 1~25 ppm, and the normalized dissolved content of strontium is 1~20 ppm. More preferred is a normalized dissolved content of calcium of 5~20 ppm, and a normalized dissolved content of strontium of 3~17 ppm, with which it is found that the luminescence brilliance of the phosphor conforming to such a range is evidently increased.

A phosphor having an electrical conductivity lower than 200 μs/cm refers to a phosphor having an electrical conductivity lower than 200 μs/cm when tested using the following testing method. Method for testing the electrical conductivity of the phosphor was as follows: Pure water (electrical conductivity less than 1 μs/cm) was mixed with a phosphor to form a test mixed solution having 1% by weight of phosphor. The test mixed solution was then stirred for 30 minutes in an 80° C. water bath, after which the test mixed solution was left to stand until it reached room temperature, and the upper layer clear solution of the test mixed solution was taken and electrical conductivity measurements was carried out thereon. If the measured electrical conductivity value was lower than 200 μs/cm, then the phosphor was said to be a phosphor having electrical conductivity lower than 200 μs/cm. If the measured value was above 200 μs/cm, then an acid cleaning process was carried out on the phosphor until the electrical conductivity was lower then 200 μs/cm. The phosphor acid cleaning method was as follows: The phosphor was mixed with 0.5% by weight of nitric acid solution to form a acid cleaning mixed solution containing 1% by weight of the phosphor. The acid cleaning mixed solution then underwent ultrasonic vibration at room temperature for 30 minutes. After filtering, the phosphor was added to 100-fold of pure water, hermetically sealed and then stirred for 30 minutes in an 80° C. water bath, and then filtered. The aforementioned pure water cleaning and filtration steps were repeated four times. After the final filtration step, the phosphor underwent the aforementioned electrical conductivity testing method to measure electrical conductivity value.

When measuring the dissolved content of normalized calcium or normalized strontium, the phosphor with electrical conductivity lower than 200 μs/cm was mixed with pure water according to a 1:100 proportion by weight to form a mixed solution of the phosphor and water, and the mixed solution was sealed in a container to prevent water loss during the heating process. The heating device was a drying oven, and after heating the mixed solution for 40 hours at 80° C., the mixed solution of the phosphor and water was cooled to room temperature.

One of the measuring methods for a normalized overdose content of calcium of the phosphor is determined by the normalized dissolved content of calcium. The normalized dissolved content of calcium refers to the measured calcium content of the aqueous phase of the mixed solution after undergoing the aforementioned procedure divided by the value of p in the constituent formula $Ca_pSr_qM_mA_aB_bO_tN_n:Z_r$.

The normalized dissolved content of strontium refers to the measured strontium content of the aqueous phase of the mixed solution after undergoing the aforementioned procedure divided by the value of q in the constituent formula $Ca_pSr_qM_mA_aB_bO_tN_n:Z_r$.

When a 455 nm light source is used to illuminate the phosphor of the present invention, then the phosphor is excited and the dominant wavelength of the emitted light is 600~680 nm, and the color coordinates (x,y) of the emitted light base on CIE 1931 chromaticity diagram are $0.45 \leq x \leq 0.72$, $0.2 \leq y \leq 0.5$. The dominant wavelength of the emitted light refers to the wavelength of greatest luminescence intensity.

In one of the preferred examples of the present invention, $0<p<1$, $0 \leq q<1$, $0 \leq m \leq 0.05$, $0 \leq t \leq 0.1$, $0.00001 \leq r \leq 0.1$, $p+q+m+r=[1/(1+t)]$, $a=1$, $b=(1-t)/(1+t)$, $n=(3-t)/(1+t)$; and the normalized dissolved content of the calcium of the phosphor is 1~25 ppm. Taking luminescence brilliance into consideration, the composition of the phosphor is $Ca_pSr_qM_mA_aB_bO_tN_n:Z_r$, and may exist in a single phase. However, because the synthesis process is affected by factors including addition of fluxing agents, impurities in the raw materials, contamination during the processing process, and volatilization of the raw materials, thus there is the possibility composed of a single phase but it may be composed of a mixture thereof with the other crystal phases or an amorphous phase, however, as long as under the prerequisite that the luminescence brilliance is not affected, then the principle of the present invention is maintained.

Results from constituent analysis of the examples of phosphor have found a slight deviation in the values calculated for m, a, b, t, n for each of the elements compared to the calculated values for m, a, b, t, n of raw materials. This phenomenon is thought to occur during firing, when a small quantity of the raw materials decompose or evaporate, or results from analytical errors. In particular, deviations in the value for t, which can be thought to occur because, the raw materials from the beginning contain oxygen, or oxygen adheres to the surfaces, or when weighing the raw materials, and when mixing and firing, causing surface oxidization of the raw materials, thus, oxygen mixed into the raw materials, and, after firing, is adsorbed into the moisture content or oxygen of the surface of the phosphor. In addition, when firing is carried out in an environment containing nitrogen and/or ammonia, the oxygen contained in the raw materials might possibly separate therefrom and be replaced by the nitrogen, and thus the deviations in t, n value will occur.

When manufacturing the phosphor of the present invention, it is preferred that nitrides are used for the raw material of calcium and strontium. Manufacturing method of the nitrides involves: required divalent metals are selected fired in an atmosphere of high-purity nitrogen gas. It is preferred that firing is carried out in an atmosphere of high-purity nitrogen, meaning that the high-purity nitrogen is above 99.99% pure nitrogen. Moreover, the flow rate of the nitrogen must be controlled to maintain a high flow rate state thereof. For example, when firing calcium nitride, 10~70 liters/min is preferred, and 30~50 liters/min is more preferred; when firing strontium nitride, 70~90 liters/min is preferred, and 80~90 liters/min is more preferred. A too high or too low flow rate of the nitrogen prevents the synthesis of appropriate nitrides, thereby control of the flow rate of the nitrogen enabling the synthesized phosphor to be provided with normalized dissolved content of calcium and normalized dissolved content of strontium within a specified range of the present invention. A temperature between 600° C.~900° C. is preferred for the firing temperature of calcium nitride, and a temperature between 700° C.~800° C. is more preferred. A temperature between 600° C.~1000° C. is preferred for the firing temperature of strontium nitride, and a temperature between 700° C.~900° C. is more preferred. A too high or too low firing temperature prevents the required appropriate nitrides from being obtained. The preferred firing time for calcium nitride is between 3~12 hours, and between 3~10 hours is more preferred. The preferred firing time for strontium nitride is between 3~24 hours, and between 5~24 hours is more preferred. A firing time that is too long or too short prevents the required appropriate nitrides from being obtained. Moreover, heating rate of the firing process must be especially controlled, that is, when the temperature is lower 200° C. than the melting point of the calcium metal, or lower 150° C. than the melting point of the strontium metal, then the heating rate must be slower. For example, heating rate of 5° C./min preferred, and heating rate of 3° C./min is more preferred. The reason for this is because when carrying out nitridation reaction of the metal, if the heating rate when close to the melting point of the metal is too high, then the metal surface easily melts, causing a nitridation reaction on the surface of metal, thereby preventing the required appropriate calcium nitride and strontium nitride from being obtained. A BN (boron nitride) crucible or silicon nitride crucible is preferred for use as the container for firing, in which a BN (boron nitride) crucible is the optimum preference. The nitridation equation of the calcium and strontium is depicted as follows:

$$3Ca+N_2 \rightarrow Ca_3N_2$$

$$3Sr+N_2 \rightarrow Sr_3N_2$$

When manufacturing the phosphor of the present invention, raw materials of A (+III valence) and B (+IV valence) may be respectively selected from the respective nitride compounds, oxide compounds, or any form of compound thereof. For example, a mixture of an A nitride (AN)/oxide compound ($A_2O_3$), or an A and B nitride (AN, $B_3N_4$). The so-called oxide compounds are not only limited to oxygen contained compounds. Other compounds, such as carbonates and oxalates, will decompose during firing, and compounds containing the respective element and oxygen s also belong to the aforementioned range of "oxide compounds". As for nitrides, this refers to compounds provided with the respective element and nitrogen.

The raw materials for the phosphor of the present invention can be various different forms of precursors, and for the purpose of convenience, a description of an implementation method using nitride raw material is provided hereinafter. Although the raw material of various nitrides of A and B are commercially available, however, because the higher the purity the better the results, thus, above 3N of raw material is prepared for optimum results. From the viewpoint of promoting a reaction, it is preferred that the particles of each raw material is minute size. However, due to different particle sizes and shapes of raw material, thus, the particle sizes and shapes of the phosphor obtained will be different. Hence, all that is needed is to prepare nitride compounds of approximately the same size as those of the final particle sizes required for the phosphor. The raw material of Eu from commercially available oxide compounds, nitride raw material or metal is preferred. And the higher the purity the better the results, thus, above 3N is preferred, more particularly, raw material of above 4N is the optimum preference.

Mixing methods of the raw materials can use dry methods and wet methods, which include a variety of implementation methods such as dry ball grinding methods or wet ball grinding methods, and is not limited to a particular method. In addition, when weighing out and mixing $Ca_3N_2$, $Sr_3N_2$, these compounds are easily oxidized, thus, it is more appropriate to carry out within an inactive atmosphere of a glove box. Moreover, because the nitrides of each of the raw materials are easily affected by moisture, thus, it is best to use inactive gases that the moisture content has been thoroughly removed. The mixing device can be selected from a conventional ball grinder or a mortar.

When preparing the phosphor, each of the raw materials is mixed according to a specified weighing proportion, placed into a crucible, and the crucible together with the raw materials placed into a high temperature furnace for firing. When firing, the firing temperature is carried out at a high temperature, thus, it is preferred the furnace uses a metal resistor resistive heating type or a graphite resistor resistive heating type. It is preferred that the firing method without external mechanical pressure such as normal pressure firing methods or a gas pressure (using gas compression) firing methods. It is preferred that the crucible is made from high-purity material that does not contain impurities, including crucibles that can be used in an inactive environment, such as a $Al_2O_3$ crucible, $Si_3N_4$ crucible, AlN crucible, sialon crucible and a BN (boron nitride) crucible. However, it is preferred that a BN crucible is used to prevent the mixing of impurities originating from the crucible. The firing atmosphere is nonoxidizing gas, such as nitrogen, hydrogen, ammonia, argon, or a combination of any of the aforementioned gases. Firing temperature of the phosphor is above 1200° C. and below 2200° C., and more preferred is a temperature above 1400° C. and below 2000° C.; heating rate is 3~15° C./min. Firing carried out at a relatively low temperature enables obtaining a relatively tiny phosphor, while firing carried out at a relatively high temperature enables obtaining a phosphor of relatively large particle size. The firing time differs according to the types of raw materials used, but in general, a reaction time of 1~10 hours is preferred. Regarding the pressure during firing in an inactive environment, it is preferred that firing is carried out below 0.5 Mpa (below 0.1 MPa is especially preferred). After firing is completed, it is cooled to room temperature, and ball grinding, or an industrial pulverizer can be used to pulverize the fired compound, after which filtration, drying and grading steps are carried out, thereby obtaining the phosphor of the present invention.

In order to obtain a high brightness phosphor of high brilliance, during firing, the effect of factors such as addition of fluxing agents, impurities in the raw materials and contamination during the processing procedure, the amount of impurities contained in the described phosphor should be as little as possible. In particular, the presence of large amounts of elements such as fluorine, boron, chlorine and carbon will suppress luminescence. Hence, high purity raw materials are selected, and the synthesizing steps are controlled to prevent contamination, thereby the aforementioned elements of fluorine, boron, chlorine, carbon are respectively less than 1000 ppm.

When the phosphor of the present invention is used in powder form, then it is preferred that the average particle diameter of the phosphor powder is below 20 µm. The reason for which is because the emitted light of the phosphor powder is primarily emitted from the surfaces of the particles. If the average particle diameter is below 20 µm (in the present invention, so-called "average particle diameter" refers to the median value $D_{50}$ of the volume-related particle distribution, it means 50% of the particles of the distribution are smaller and the other 50% are larger than the median value), then corresponding the surface area of each unit weight of the phosphor powder to a desired value, thus preventing reduction in brilliance. In addition, under circumstances whereby the phosphor powder is coated on a light-emitting element, then density of the phosphor powder can be increased, and from this standpoint, reduction in brilliance is prevented. Moreover, according to a research was carried out by the inventors, it is known that the preferred average particle diameter is larger than 1 µm from the standpoint of the luminescence efficiency of the phosphor powder. According to that described above, it is preferred that the average particle diameter of the phosphor powder of the present invention is above 1 µm and below 20 µm, more particularly, optimum preference is particle diameters of above 3.0 µm and below 15 µm. As for the so-called "average particle diameter ($D_{50}$)", a Multisizer-3 manufactured by Beckman Coulter Company is used to measure the value by means of the Coulter Counter.

The phosphor of the present invention is applicable for use in a vacuum fluorescent display (VFD), field emission display (FED), plasma display panel (PDP), cathode ray tube (CRT), light-emitting diode (LED), and the like. In particular, when a 455 nm light source is used to illuminate the phosphor of the present invention, the dominant wavelength of the emitted light is 600~680 nm, and the CIE 1931 color coordinates (x,y) on the chromaticity diagram of the emitted light are $0.45 \leq x \leq 0.72$, $0.2 \leq y \leq 0.5$; moreover, luminescence brilliance is high, and is thus especially suitable for use in light-emitting diodes.

A light-emitting device of the present invention comprises a semiconductor light-emitting element and the phosphor of the present invention. A semiconductor light-emitting element emitting light of wavelength 300~550 nm is preferred, more particularly, an ultraviolet (or violet) semiconductor light-emitting element emitting light of wavelength 330~420 nm or blue light semiconductor light-emitting element emitting light of wavelength 420~500 nm are more preferred. As for the light-emitting element, the semiconductor light-emitting element can be various types of semiconductors, including zinc sulfide or gallium nitride semiconductor light-emitting elements. And regarding the luminescence efficiency, a gallium nitride semiconductor is preferred. The gallium nitride light-emitting element can be manufactured by methods such as Metal Organic Chemical Gaseous Phase Deposition (MOCVD) or Hydride Vapor Phase Epitaxy (HVPE) on a baseplate to form a nitride semiconductor. The semiconductor light-emitting element formed from $In_\alpha Al_\beta Ga_{1-\alpha-\beta}N$ ($0 \leq \alpha$, $0 \leq \beta$, $\alpha+\beta<1$) is the optimum preference. The semiconductor structure can be an isotropic structure, including MIS (metal-insulator semiconductor) junctions, PIN junctions, PN junctions, and the like, heterojunction structures or double heterojunction structures. In addition, material of the semiconductor layer or degree of mixed crystals can be modified to adjust the wavelength of the emitted light.

The light emitting device of the present invention, apart from exclusively comprising the phosphor of the present invention. Moreover, the phosphor of the present invention can also be used together with phosphors provided with other light emitting characteristics to fabricate a light emitting device that is able to emit the required color. For example, using a 330~420 nm ultraviolet semiconductor light-emitting element as a excited light source, a blue light phosphor excited by these wavelengths to emit wavelengths of above 420 nm and below 500 nm, and exciting a green light phosphor to emit wavelengths above 500 nm and below 570 nm, which can be assembled with the phosphor of the present invention. An example of the aforementioned blue light phosphor is $BaMgAl_{10}O_{17}$:Eu, the green phosphor can be a β-Sialon phosphor. Based on aforementioned, when ultraviolet rays emitted from the semiconductor light-emitting element illuminates the phosphor, red, green, blue tricolored light is emitted, which forms a white light light-emitting device.

In addition, a 420~500 nm blue semiconductor light-emitting element can also be used as a excited light source, and a yellow phosphor excited by these wavelengths to emit wavelengths of above 550 nm and below 600 nm can be assembled with the phosphor of the present invention. An example of the aforementioned yellow phosphor is $(Y,Gd)_3(Al,Ga)_5O_{12}$:Ce. Based on aforementioned, when blue light emitted from the semiconductor light-emitting element illuminates the phosphor, red and yellow bicolored light is emitted, which is mixed with the blue light emitted from the semiconductor light-emitting element itself to form a white light or light bulb color illuminating appliance.

Furthermore, a 420~500 nm blue semiconductor light-emitting element can be used as a excited light source, and a green phosphor excited by these wavelengths to emit wavelengths of above 500 nm and below 570 nm can be assembled with the phosphor of the present invention. Such a green phosphor can be a β-Sialon phosphor. Based on aforementioned, when blue light emitted from the semiconductor light-emitting element illuminates the phosphor, red and green bicolored light is emitted, which is mixed with the blue light emitted from the semiconductor light-emitting element itself to form a white light illuminating appliance.

Examples and Comparative Examples

The following provides descriptions of the Examples and Comparative Examples of the present invention, however, the present invention is not limited to such Examples.
Description of the Measuring Method:
(1) Brilliance and color coordinates of the phosphor: Wavelengths of 455 nm were used to illuminate the phosphor and measurements were carried out by means of a brilliance meter TOPCON SR-3A. Measurement inaccuracy in brilliance values were within ±0.3%.
(2) Dominant wavelength of the light emitted from the phosphor: Measurements were carried out by means of a Jobin YVON Fluoro Max-3. Dominant wavelength of the emitted light refers to the wavelength of the greatest luminescence intensity when using 455 nm light to excite the phosphor.
(3) Analysis of the elemental composition of the phosphor:
  (3-1a) Apparatus: Measurements were carried out by means of a Jobin YVON ULTIMA-2 (model inductively coupled plasma atomic emission spectrometer (ICP)).
  (3-1b) Sample Preprocessing: 0.1 g of samples were accurately weighed out, placed in a platinum crucible and 1 g of $Na_2CO_3$ added and mixed evenly therewith, after which the mixture was fused in a high temperature furnace at 1200° C. (temperature conditions: temperature was raised from room temperature to 1200° C. in 2 hours, and then the temperature was retained for 5 hours). After cooling down, the fuse was added to an acid solution, such as 25 ml of HCl (hydrochloric acid) (36%), heated to dissolve and clarify the fuse, and, after cooling, placed in a 100 ml PFA volumetric flask and a definite quantity of pure water added to a gauge mark.
  (3-2a) Apparatus: Horiba nitrogen-oxygen analyzer. Model: EMGA-620W.
  (3-2b) Measurements: 20 mg of the phosphor was placed into a tin capsule, and then placed in a crucible for measurements.
(4) Measurement of normalized dissolved content of calcium and strontium:
  (4a) Apparatus: Measurements were carried out by means of a Jobin YVON ULTIMA-(inductively coupled plasma atomic emission spectrometer (ICP)).
  (4b) Preprocessing: A phosphor with electrical conductivity lower than 200 μs/cm was prepared, and pure water was added in a 1:100 weight ratio of the phosphor to pure water to form a mixed solution. After heating for 40 hours at a temperature of 80° C., the mixed solution was cooled to room temperature and filtered through a filtration membrane with 0.45 nm apertures. The aqueous phase of the mixed solution was measured by means of ICP.
(5) Electrical conductivity meter: A suntex sc-170.
(6) $D_{50}$ average particle diameter analysis of the phosphor: Measurements were carried out by means of a Beckman Coulter Multisizer-3. $D_{50}$ represents median value of the volume-related particle distribution, it means 50% of the particles of the distribution are smaller and the other 50% are larger than the median value.

Example 1

The required calcium metal (2N) was prepared and placed in a pure nitrogen atmosphere for firing. Nitrogen flow rate was 50 liters/min, starting from room temperature raised to medium temperature, with heating rate of 5° C./min. When the temperature reached the medium temperature of 650° C., the heating rate was changed to 5° C./min until a temperature of 750° C., whereupon firing was maintaining the constant temperature of 750° C. for 12 hours, after which the temperature was lowered to room temperature at a speed of 10° C./min, thereby obtaining the compound calcium nitride ($Ca_3N_2$).

The required strontium metal (2N) was prepared and placed in a pure nitrogen atmosphere for firing. Nitrogen flow rate was 85 liters/min, starting from room temperature raised to medium temperature, with temperature rise speed being 10° C./min. When the temperature reached the medium temperature of 620° C., the temperature rise speed was changed to 1° C./min until a temperature of 900° C., whereupon firing was maintaining the constant temperature of 900° C. for 24 hours, after which the temperature was lowered to room temperature at a speed of 10° C./min, thereby obtaining the compound strontium nitride ($Sr_3N_2$).

Each of the raw material powders, including the aforementioned synthesized $Ca_3N_2$, $Sr_3N_2$ and commercially available AlN(3N), $Si_3N_4$(3N), $Eu_2O_3$(4N), was weighed out according to the proportion of 0.2/3 moles of $Ca_3N_2$, 0.792/3 moles of $Sr_3N_2$, 1 mole of AlN, 1/3 moles of $Si_3N_4$, and 0.008/2 moles of $Eu_2O_3$. Then a mortar was used to mix the compounds in a glove box with nitrogen environment. See Table 2 for the mole proportions of each element in the mixed raw material powder. The aforementioned mixed raw material powder was then placed into a boron nitride crucible, and the crucible was placed into a high temperature furnace. The atmosphere inside the furnace was a high purity nitrogen environment, and the gas flow rate was 80 liters/minute. The temperature was raised to 1800° C. based on a heating rate of 10° C./minute, whereupon the temperature was retained at 1800° C. for 12 hours to carry out firing. The temperature was then lowered to room temperature based on a heating rate of 10° C./min, whereupon pulverizing, ball grinding, filtration, drying, and grading steps were respectively carried out to obtain the phosphor of the present invention. The result from average particle diameter ($D_{50}$) analysis was 8.5 μm. Results from nitrogen-oxygen analysis and ICP analysis were Ca: 4.71% by weight, Sr: 34.33% by weight, Al: 16.13% by weight, Si: 16.70% by weight, N: 23.96% by weight, O: 1.59% by weight, and Eu: 0.67% by weight; and actual formula was $Ca_{0.197}Sr_{0.655}Al_1Si_{0.995}N_{2.861}O_{0.166}:Eu_{0.007}$, that is in the formula $Ca_pSr_qM_mA_aB_bO_tN_n:Z_r$ p=0.197, q=0.655, m=0, t=0.166, r=0.007, a=1, b=0.995, and n=2.861. Thus, the overall content of calcium of the phosphor is defined to be 0.6423. The overdose content of calcium can be measured, for example, by detecting the calcium content in the aqueous phase of the mixed solution. 0.1 g of a phosphor with electrical conductivity lower than 200 μs/cm was placed in a container, and pure water was added in according to a 1:100 weight ratio of the phosphor to pure water. After mixing, the container was sealed and heated for 40 hours at a temperature of 80° C., after which the mixed solution was cooled to room temperature. Calcium content in the solution was ascertained to be 0.47 ppm, and the normalized dissolved content of calcium was (0.47/0.197)=2.4 ppm. Strontium content in the solution was ascertained to be 0.45 ppm. Therefore, the normalized overdose content of strontium in this embodiment can be defined by the normalized dissolved content of strontium content and is (0.45/0.655)=0.7 ppm. Furthermore, after the phosphor is excited by light with wavelength of 455 nm, the dominant wavelength of the emitted light from the phosphor was measured to be 616 nm, the color coordinates on CIE 1931 chromaticity diagram were x=0.634, y=0.364, and luminescence brilliance was 167% (see Table 3). Luminescence brilliance of the embodiments and comparative examples in the present invention is relative to the luminescence brilliance (100%) of the phosphor in comparative example 8 described below.

Examples 2~4 and Comparative Examples 1~3

Synthesis of calcium nitride was carried out according to the conditions as depicted in Table 1, mole ratio of each of the elements in the mixed raw material powder was depicted in Table 2, while the remaining procedures were as in Example 1. Test results for the properties of the phosphor are depicted in Table 3. It can be seen from the experimental results depicted in Table 3 that adjustment of the firing conditions of the calcium nitride, thereby the normalized dissolved content of calcium was within the 1~25 ppm range, then a preferred brilliance value was obtained.

Examples 5~7 and Comparative Examples 4~5

Synthesis of calcium nitride was carried out according to the conditions as depicted in Table 1, mole ratio of each of the elements in the mixed raw material powder was depicted in Table 2, while the remaining procedures were as in Example 1. Test results for the properties of the phosphor are depicted in Table 3. In Example 5, normalized dissolved content of calcium was 16.1 ppm, and normalized dissolved content of strontium was 0.6 ppm. Experimental results enabled obtaining the same conclusions as described above, and when the normalized dissolved content of calcium was within the 1~25 ppm range, then a preferred brilliance value was obtained.

Examples 8~10 and Comparative Examples 6~7

Synthesis of calcium nitride was carried out according to the conditions as depicted in Table 1, mole ratio of each of the elements in the mixed raw material powder was depicted in Table 2, In Table 2, $Y_2O_3$(3N) was used for Y. $GeO_2$(3N) was used for Ge, and ZnO(3N) was used for Zn, while the remaining procedures were as in Example 1. Test results for the properties of the phosphor are depicted in Table 3. Experimental results enabled obtaining the same conclusions as described above, and when the normalized dissolved content of calcium was within the 1~25 ppm range, then a preferred brilliance value was obtained.

Examples 11~12

After pulverising, the required strontium metal (2N) in Example 11 was placed in a pure nitrogen atmosphere for firing. Nitrogen flow rate was 85 liters/min, and the temperature rise speed was 10° C./min. When the temperature reached the approximate temperature of 620° C., the speed of temperature rise speed was changed to 3° C./min until a temperature of 800° C., whereupon firing was maintaining the constant temperature of 800° C. for 24 hours, after which the temperature was lowered to room temperature at a speed of 10° C./min, thereby obtaining the strontium nitride ($Sr_3N_2$) compound. The nitridation method for the synthesis of strontium nitride compound in Example 12 was carried out under the same conditions as above, except the firing conditions was changed to the constant temperature of 780° C. for 20 hours.

Synthesis of calcium nitride was carried out according to the conditions as depicted in Table 1, mole ratio of each of the elements in the mixed raw material powder was depicted in Table 2, while the remaining procedures were as in Example 1. Test results for the properties of the phosphor are depicted in Table 4. When Example 11 both with the normalized dissolved content of calcium within the 1~25 ppm range and the normalized dissolved content of strontium within the 1~20 ppm range was compared to Example 1 merely with the normalized dissolved content of calcium within the 1~25 ppm range, it can be learned from the experimental results that on the same chromaticity coordinates, the brightness of Example 11 is clearly increased by 5%. Example 12 and Example 5 are provided with the same conclusion as described above and the difference in brilliance is 3%. And reveals that when the normalized dissolved content of calcium is within the 1~25 ppm range and the normalized dissolved content of strontium is within the 1~20 ppm range, then the more preferred brilliance is obtained.

Example 13 and Comparative Examples 8~9

Synthesis of calcium nitride was carried out according to the conditions as depicted in Table 1, mole ratio of each of the elements in the mixed raw material powder was depicted in Table 2, while the remaining procedures were as in Example 1. Test results for the properties of the phosphor are depicted in Table 3. Experimental results enabled obtaining the same conclusions as described above, and when the normalized dissolved content of calcium was within the 1~25 ppm range, then a preferred brilliance value was obtained.

TABLE 1

|  | Nitrogen flow rate | Heating rate from room temp. to medium temp. °C./min | Medium temp. °C. | Heating rate from medium temp. to retained temp. °C./min | Retained temp. °C. & Time (hrs) |
|---|---|---|---|---|---|
| Comparative Example 1 | 100 | 10 | 650 | 1 | 750, 24 |
| Example 1 | 50 | 10 | 650 | 5 | 750, 12 |
| Example 2 | 50 | 10 | 650 | 5 | 750, 8 |
| Example 3 | 50 | 10 | 650 | 5 | 750, 4 |
| Example 4 | 50 | 10 | 650 | 5 | 700, 4 |
| Comparative Example 2 | 50 | 10 | 650 | — | 650, 4 |
| Comparative Example 3 | 25 | 10 | 600 | — | 600, 4 |
| Comparative Example 4 | 100 | 10 | 650 | 1 | 750, 24 |
| Example 5 | 30 | 10 | 650 | 5 | 750, 4 |
| Example 6 | 30 | 10 | 650 | 5 | 720, 4 |
| Example 7 | 30 | 10 | 650 | 5 | 700, 4 |
| Comparative Example 5 | 50 | 10 | 650 | — | 650, 4 |
| Comparative Example 6 | 100 | 10 | 650 | 1 | 750, 24 |
| Example 8 | 70 | 10 | 650 | 5 | 750, 8 |
| Example 9 | 70 | 10 | 650 | 5 | 750, 4 |
| Example 10 | 70 | 10 | 650 | 5 | 700, 8 |
| Comparative Example 7 | 50 | 10 | 650 | 5 | 600, 4 |
| Example 11 | 50 | 10 | 650 | 5 | 750, 8 |
| Example 12 | 50 | 10 | 650 | 5 | 750, 4 |
| Comparative Example 8 | 100 | 10 | 650 | 1 | 750, 24 |
| Example 13 | 70 | 10 | 650 | 5 | 750, 8 |
| Comparative Example 9 | 50 | 10 | 650 | — | 650, 4 |

Note:
"—" in Table 1 represents that the medium temperature equals the retained temperature.

TABLE 3

|  | Normalized dissolved content of calcium (ppm) Calcium | Dominant wavelength of emitted light (nm) | Color coordinates x | Color coordinates x | Brilliance (%) |
|---|---|---|---|---|---|
| Comparative Example 1 | 0.4 | 616 | 0.634 | 0.364 | 163 |
| Example 1 | 2.4 | 616 | 0.634 | 0.364 | 167 |
| Example 2 | 9 | 616 | 0.633 | 0.364 | 170 |
| Example 3 | 16.5 | 616 | 0.634 | 0.363 | 168 |
| Example 4 | 23.7 | 616 | 0.635 | 0.364 | 166 |
| Comparative Example 2 | 27.6 | 616 | 0.634 | 0.364 | 160 |
| Comparative Example 3 | 28.1 | 618 | 0.637 | 0.360 | 155 |
| Comparative Example 4 | 0.6 | 626 | 0.654 | 0.344 | 125 |
| Example 5 | 16.1 | 626 | 0.654 | 0.343 | 130 |
| Example 6 | 20.8 | 626 | 0.654 | 0.344 | 128 |
| Example 7 | 24.1 | 626 | 0.655 | 0.344 | 128 |
| Comparative Example 5 | 26.7 | 626 | 0.654 | 0.344 | 118 |
| Comparative Example 6 | 0.5 | 636 | 0.666 | 0.332 | 97 |
| Example 8 | 9.3 | 636 | 0.666 | 0.332 | 100 |
| Example 9 | 16.1 | 636 | 0.666 | 0.332 | 101 |
| Example 10 | 22.3 | 636 | 0.665 | 0.332 | 100 |
| Comparative Example 7 | 32.1 | 636 | 0.666 | 0.332 | 88 |
| Comparative Example 8 | 0.6 | 642 | 0.680 | 0.317 | 59 |
| Example 13 | 9.6 | 642 | 0.680 | 0.317 | 64 |
| Comparative Example 9 | 28.3 | 642 | 0.680 | 0.316 | 56 |

TABLE 2

|  | Ca | Sr | Zn | Al | Y | Si | Ge | O | N | Eu |
|---|---|---|---|---|---|---|---|---|---|---|
| Examples 1~4, 11 & Comparative Examples 1~3 | 0.2 | 0.792 | 0 | 1 | 0 | 1 | 0 | 0.012 | 2.995 | 0.008 |
| Examples 5~7, 12 & Comparative Examples 4~5 | 0.45 | 0.542 | 0 | 1 | 0 | 1 | 0 | 0.012 | 2.995 | 0.008 |
| Example 8 & Comparative Examples 6~7 | 0.645 | 0.342 | 0.005 | 1 | 0 | 1 | 0 | 0.012 | 2.995 | 0.008 |
| Example 9 | 0.65 | 0.342 | 0 | 0.999 | 0.001 | 1 | 0 | 0.012 | 2.995 | 0.008 |
| Example 10 | 0.65 | 0.342 | 0 | 1 | 0 | 0.999 | 0.001 | 0.012 | 2.995 | 0.008 |
| Example 13 & Comparative Examples 8~9 | 0.992 | 0 | 0 | 1 | 0 | 1 | 0 | 0.012 | 2.995 | 0.008 |

TABLE 4

| | Normalized dissolved content of calcium, strontium (ppm) | | Dominant wavelength of emitted light | Color coordinates | | Brilliance |
|---|---|---|---|---|---|---|
| | Calcium | Strontium | (nm) | x | x | (%) |
| Example 11 | 7.5 | 8.5 | 616 | 0.634 | 0.364 | 176 |
| Example 12 | 6.2 | 12.1 | 626 | 0.654 | 0.344 | 135 |

Brilliance of the phosphor of the present invention is measured by means of a brilliance measuring device. Referring to FIG. 1, which shows a brilliance measuring device comprising a black box 11, a sample holder 12, a light source 13, a light guide tube 14, a reflector 15 and a brilliance meter 16, in which the sample holder 12 is disposed in the box 11, and the light source 13 is perpendicularly disposed approximately 5 centimeters high above the sample holder 12. Diameter of the light guide tube 14 is approximately 2 centimeters, and is disposed so as to form a 45° angle to the light source 13. The reflector 15 is disposed within the light guide tube 14, and is positioned at a distance approximately 8 centimeters from the sample holder 12. Moreover, the distance between the brilliance meter 16 and the reflector 15 is approximately 40 centimeters. After the phosphor disposed in the sample holder 12 is illuminated by the light source 13, then the light guide tube 14 and the reflector 15 horizontally guide the fluorescent light emitted from the phosphor into the brilliance meter 16 for brilliance measurements to be carried out.

More specifically, for each of the aforementioned Examples and Comparative Examples of the present invention, measurement of the brilliance of the phosphor was carried out by taking 1.3 grams of the sample under test and placing it into the sample holder 12, the sample was then flattened to be uniformly distributed the sample in the sample holder 12. The sample holder 12 was then placed within the box 11, and the light source 13 emitting a wavelength of 455 nm was used to vertically illuminate the sample. Moreover, the brilliance meter 16 (manufactured by TOPCON, model No. SR-3A) using field 1° detection mode was used to detect the luminescence brilliance.

Furthermore, the dominant wavelength of the luminescence spectrum of the phosphor refers to the wavelength of greatest luminous intensity.

Manufacture of the light emitting device of the present invention was completed in virtue of carrying out encapsulation of the phosphor of the aforementioned Examples and the semiconductor light-emitting element.

Figure 2:
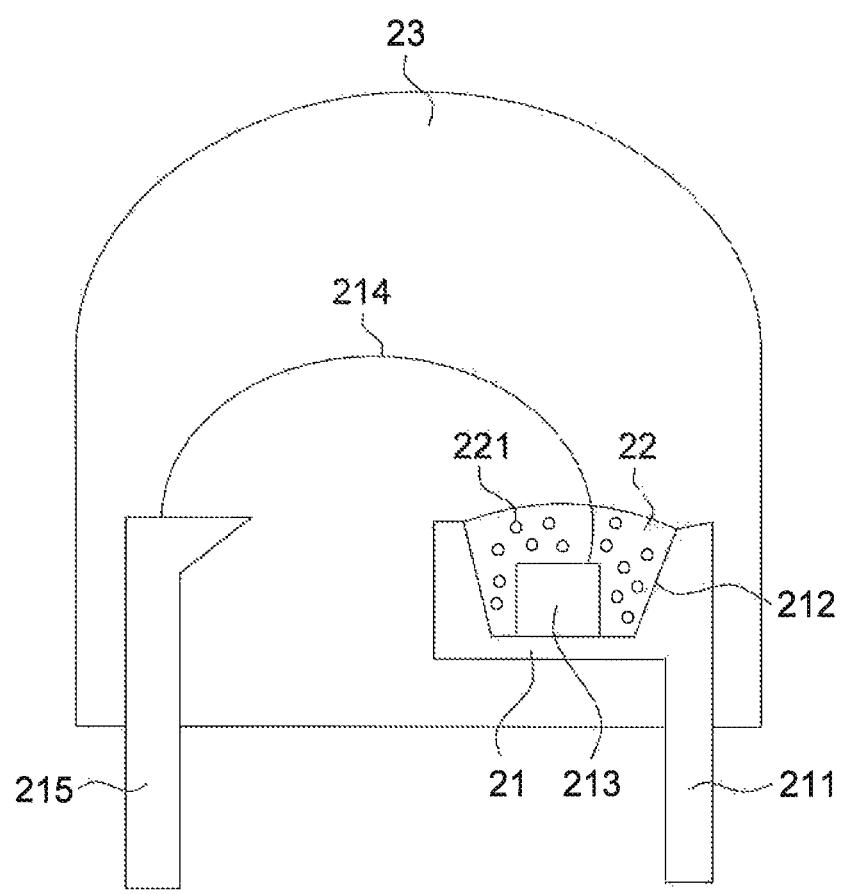
FIG. 2 is a cross-section schematic view of an embodiment depicting a light emitting device of the present invention.

Referring to FIG. 2, which shows an embodiment of the light emitting device of the present invention comprising a semiconductor light-emitting element 21, a luminescent layer 22 and an encapsulation layer 23. In which the semiconductor light-emitting element 21, comprising a base 211, is used to conduct electricity and provided with a loading end 212 that substantially having a concave form, a light-emitting diode 213 is disposed in the concave loading end 212 and electrically is connected to the base 211, a connecting wire 214 is electrically connected to the light-emitting diode 213, and a conducting wire 215 is electrically connected to the connecting wire 214. In which the base 211 and the conducting wire 215 is used to transmit externally provided electrical energy t to the light-emitting diode 213. The light-emitting diode 213 is used to receive the electrical energy and convert the energy into output light. The embodiment of the present invention bonds the commercially available InGaN blue light-emitting diode 213 (manufacturer: Chimei Lighting Technology) with light emitting wavelength of 455 nm to the loading end 212 of the base 211 in virtue of electric conductive silver paste (model: BQ6886, manufacturer: UNINWELL). Then, the connecting wire 214 electrically connected to the light-emitting diode 213 and with the conducting wire 215 are made to extend from the top end of the light-emitting diode 213.

The luminescent layer 22 covers the light-emitting diode 213. The phosphor 221 contained in the luminescent layer 22 is excited by the light emitted from the light-emitting diode 213, and converts to emit light different from the excitation light wavelength. In this embodiment, the luminescent layer 22 is formed by coating silicone resin containing 35% by weight of the phosphor 221 on the outer surface of the light-emitting diode 213 and dried, hardened.

The encapsulation layer 23 covers the portions of the semiconductor light-emitting element 21, including base 211, the connecting wire 214, a portion of the conducting wire 215 and the luminescent layer 22.

In conclusion, the present invention is achieved by adjusting a proportion of each of the elements of the phosphor, and in combination with controlling the normalized dissolved content of calcium to within 1~25 ppm in the phosphor, so as to obtain a high brilliance phosphor emitting light with a dominant wavelength of 600~680 nm. Moreover, the phosphor in combination with a semiconductor light-emitting element enables obtaining a light emitting device of high brilliance.

It is of course to be understood that the embodiment and Examples described herein are merely illustrative of the principles of the invention and that a wide variety of modifications thereto may be effected by persons skilled in the art without departing from the spirit and scope of the invention as set forth in the following claims.

What is claimed is:

1. A phosphor, comprising a constituent having formula $Ca_pSr_qZn_mA_aB_bO_tN_n:Eu_r$, wherein A is selected from the group of aluminum and yttrium; B is selected from the group of silicon and germanium, $0.2 \leq p \leq 0.65$; $0.342 \leq q \leq 0.792$; $0 \leq m \leq 0.005$; $0 \leq t \leq 0.3$; $0.00001 \leq r \leq 0.1$; $a=1$, $0.8 \leq b \leq 1.2$; and $2.7 \leq n \leq 3.1$; and a normalized dissolved content of calcium of the phosphor is 1~25 ppm of weight; wherein the normalized dissolved content of calcium of the phosphor is equal to a calcium dissolved content of the phosphor in a solution/a calcium detected content of the phosphor.

2. The phosphor according to claim 1, wherein the normalized dissolved content of calcium is 5~20 ppm of weight.

3. The phosphor according to claim 1, wherein a normalized dissolved content of strontium of the phosphor is 1~20 ppm of weight; wherein the normalized dissolved content of strontium of the phosphor is equal to a strontium dissolved content of the phosphor in a solution/a strontium detected content of the phosphor.

4. The phosphor according to claim 1, wherein the normalized dissolved content of calcium is 5~20 ppm of weight, and the normalized dissolved content of strontium is 3~17 ppm of weight.

5. The phosphor according to claim 3, wherein $0.2 \leq p \leq 0.45$, $0.542 \leq q \leq 0.792$.

6. The phosphor according to claim 1, wherein the phosphor is excited by means of 455 nm light source to illuminate the phosphor, then the CIE 1931 color coordinates (x,y) of the phosphor on the chromaticity diagram are $0.6 \leq x \leq 0.7$, $0.3 \leq y \leq 0.4$.

7. The phosphor according to claim 3, wherein the phosphor is excited by means of 455 nm light source to illuminate the phosphor, then the CIE 1931 color coordinates (x,y) of the phosphor on the chromaticity diagram are $0.6 \leq x \leq 0.7$, $0.3 \leq y \leq 0.4$.

8. A light emitting device, comprising:
a semiconductor light-emitting element, and a phosphor;
the phosphor comprises a constituent having the formula $Ca_pSr_qZn_mA_aB_bO_tN_n:Eu_r$, wherein A is selected from the group of aluminum and yttrium; B is selected from the group of silicon and germanium; $0.2 \leq p \leq 0.65$; $0.342 \leq q \leq 0.792$; $0 \leq m \leq 0.005$; $0 \leq t \leq 0.3$; $0.00001 \leq r \leq 0.1$; $a=1$, $0.8 \leq b \leq 1.2$; and $2.7 \leq n \leq 3.1$; moreover, a normalized dissolved content of calcium of the phosphor is 1~25 ppm of weight; wherein the normalized dissolved content of calcium of the phosphor is equal to a calcium dissolved content of the phosphor in a solution/a calcium detected content of the phosphor.

9. The light emitting device according to claim 8, wherein the semiconductor light-emitting element emits light of wavelength 300~550 nm.

10. The light emitting device according to claim 8, wherein the normalized dissolved content of calcium is 5~20 ppm of weight.

11. The light emitting device according to claim 8, wherein a normalized dissolved content of strontium of the phosphor is 1~20 ppm of weight; wherein the normalized dissolved content of strontium of the phosphor is equal to a strontium dissolved content of the phosphor in a solution/a strontium detected content of the phosphor.

12. The light emitting device according to claim 11, wherein the normalized dissolved content of calcium is 5~20 ppm of weight, and the normalized dissolved content of strontium is 3~17 ppm of weight.

13. The light emitting device according to claim 11, wherein $0.2 \leq p \leq 0.45$, $0.542 \leq q \leq 0.792$.

14. The light emitting device according to claim 8, wherein the phosphor is excited by means of 455 nm light source to illuminate the phosphor, then the CIE 1931 color coordinates (x,y) of the phosphor on the chromaticity diagram are $0.6 \leq x \leq 0.7$, $0.3 \leq y \leq 0.4$.

15. The light emitting device according to claim 11, wherein the phosphor is excited by means of 455 nm light source to illuminate the phosphor, then the CIE 1931 color coordinates (x,y) of the phosphor on the chromaticity diagram are—$0.6 \leq x \leq 0.7$, $0.3 \leq y \leq 0.4$.

16. The phosphor according to claim 1, wherein $b=1$, $r=0.008$, $t=0.012$, and $n=2.995$.

17. The light emitting device according to claim 8, wherein $b=1$, $r=0.008$, $t=0.012$, and $n=2.995$.

18. The phosphor according to claim 1, wherein $m>0$.

19. The phosphor according to claim 1, wherein A is aluminum and yttrium.

20. The phosphor according to claim 1, wherein $m>0$, A is aluminum and yttrium.

21. The phosphor according to claim 1, wherein $m>0$, $t=0.012$, and $n=2.995$.

22. The light emitting device according to claim 8, wherein $m>0$.

23. The light emitting device according to claim 8, wherein A is aluminum and yttrium.

24. The light emitting device according to claim 8, wherein $m>0$, A is aluminum and yttrium.

25. The phosphor according to claim 8, wherein $m>0$, $t=0.012$, and $n=2.995$.

* * * * *